United States Patent
Chou et al.

(10) Patent No.: US 8,975,965 B2
(45) Date of Patent: Mar. 10, 2015

(54) DIFFERENTIAL SIGNAL CORRECTION CIRCUIT

(71) Applicant: National Taiwan University, Taipei (TW)

(72) Inventors: Shuo-Chun Chou, Taipei (TW); Hsi-Han Chiang, Taipei (TW); Chorng-Kuang Wang, Taipei (TW); Shen-Iuan Liu, Taipei (TW)

(73) Assignee: National Taiwan University, Taipei (TW)

( * ) Notice: Subject to any disclaimer, the term of this patent is extended or adjusted under 35 U.S.C. 154(b) by 56 days.

(21) Appl. No.: 13/790,338

(22) Filed: Mar. 8, 2013

(65) Prior Publication Data

US 2013/0278337 A1    Oct. 24, 2013

(30) Foreign Application Priority Data

Apr. 23, 2012    (TW) ............................. 101114413 A (51) Int. Cl.
| | |
|---|---|
| H03F 3/04 | (2006.01) |
| H03F 1/32 | (2006.01) |
| H03F 3/19 | (2006.01) |
| H03H 11/32 | (2006.01) |

(52) U.S. Cl.
CPC ........ *H03F 1/3282* (2013.01); *H03F 2200/372* (2013.01); *H03F 1/3211* (2013.01); *H03F 3/19* (2013.01); *H03H 11/32* (2013.01); *H03F 2203/45318* (2013.01); *H03F 2203/45352* (2013.01)
USPC ......................................................... 330/301

(58) Field of Classification Search
USPC .......................... 330/117, 252, 253, 301, 310
See application file for complete search history.

(56) References Cited

U.S. PATENT DOCUMENTS

| | | | | |
|---|---|---|---|---|
| 6,057,714 | A * | 5/2000 | Andrys et al. | 327/105 |
| 7,532,070 | B2 * | 5/2009 | Cowley et al. | 330/254 |
| 7,626,457 | B2 * | 12/2009 | Mudd et al. | 330/254 |
| 8,395,452 | B1 * | 3/2013 | Lee | 330/311 |
| 8,503,966 | B2 * | 8/2013 | Oda et al. | 330/252 |
| 2008/0191807 | A1 * | 8/2008 | Mun et al. | 330/301 |

\* cited by examiner

*Primary Examiner* — Khanh V Nguyen
(74) *Attorney, Agent, or Firm* — Huffman Law Group, PC (57) ABSTRACT

A differential signal correction circuit is disclosed. The differential signal correction circuit may comprise a first single-ended-to-differential converter and a second single-ended-to-differential converter. Each one of the two converters may comprise an input port and two output ports. The converters may be configured to perform a first phase correction for a pair of differential signals and output a first output signal and a second output signal. The first output signal is fed back to the first converter through one of the output ports of the first converter, and the second output signal is fed back to the second converter through one of the output ports of the second converter so as to perform phase correction and amplitude correction for the first output signal and the second output signal.

22 Claims, 10 Drawing Sheets

DIFFERENTIAL SIGNAL CORRECTION CIRCUIT

CROSS-REFERENCE TO RELATED APPLICATION(S)

This application claims priority to Taiwan Patent Application No. 101114413, filed on Apr. 23, 2012, the disclosure of which is hereby incorporated by reference in its entirety.

BACKGROUND OF THE DISCLOSURE

1. Field of the Disclosure

The present disclosure relates to a differential signal correction circuit.

2. Description of the Related Art

Conventionally, a mobile telephone, a wireless transmission system, and the like include a receiving device, which may use a single antenna to receive a signal. These receiving devices may often operate with harmonic distortion and common mode noise after signal processing via a chip, but these receiving devices are often plagued with bad signal to noise ratio (SNR).

Accordingly, there is a need for a differential signal correction circuit that has a good signal to noise ratio (SNR).

SUMMARY OF THE DISCLOSURE

The present disclosure describes a differential signal correction circuit that, through simultaneous phase and amplitude correction, may suppress harmonics and improve the SNR value.

In an embodiment, the differential signal correction circuit may comprise a first single-ended-to-differential converter, a second single-ended-to-differential converter, a first load, and a second load. The first single-ended-to-differential converter may have a first input port, a first output port, and a second output port, wherein the first output port may be coupled with a first output node, the second output port may be coupled with a second output node, the first input port may be configured to receive a first input signal, the first single-ended-to-differential converter may be configured to convert the first input signal into a first current signal and a second current signal, the first current signal may be outputted from the first output port, and the second current signal may be outputted from the second output port. The second single-ended-to-differential converter may have a second input port, a third output port, and a fourth output port, wherein the third output port may be coupled with the first output node, the fourth output port may be coupled with the second output node, the second input port may be configured to receive a second input signal, the second input signal and the first input signal may be a differential signal pair, the second single-ended-to-differential converter may be configured to convert the second input signal into a third current signal and a fourth current signal, the third current signal may be outputted from the third output port, and the fourth current signal may be outputted from the fourth output port. The first load may be coupled between the first output node and a first power source, wherein the first load may be configured to convert a first output current signal collected from the first current signal and the third current signal at the first output node into a first output voltage signal, and the first output voltage signal may be fed back to the first single-ended-to-differential converter for phase and gain correction. The second load may be coupled between the second output node and a second power source, wherein the second load may be configured to convert a second output current signal collected from the second current signal and the fourth current signal at the second output node into a second output voltage signal, and the second output voltage signal may be fed back to the second single-ended-to-differential converter for phase and gain correction.

In another embodiment, the differential signal correction circuit may comprise a first transistor, a second transistor, a third transistor, a fourth transistor, a first load, and a second load. A gate of the first transistor may be configured to receive a first input signal and a source of the first transistor is grounded. A source of the second transistor may be coupled with the gate of the first transistor, and a gate of the second transistor may be coupled with a drain of the first transistor. A source of the third transistor may be configured to receive a second input signal, wherein the first input signal and the second input signal are a differential signal pair. A drain of the third transistor may be coupled with the drain of the first transistor and a gate of the third transistor may be coupled with a drain of the second transistor. A gate of the fourth transistor may be coupled with the source of the third transistor, a drain of the fourth transistor may be coupled with the gate of the third transistor, and a source of the fourth transistor may be grounded. The first load may be coupled between the drain of the first transistor and a first power source. The second load may be coupled between the drain of the fourth transistor and a second power source. The first input signal and the second input signal may be phase corrected by the first transistor, the second transistor, the third transistor, and the fourth transistor. A first output current signal may be collected from a coupled node of the drain of the first transistor and the gate of the second transistor, a second output current signal may be collected from a coupled node of the gate of the third transistor and the drain of the fourth transistor, the first output current signal may be converted into a first output voltage signal by the first load, the second output current signal may be converted into a second output voltage signal by the second load, the first output voltage signal may be fed back to the first transistor and the second transistor via the coupled node of the drain of the first transistor and the gate of the second transistor, the second output voltage signal may be fed back to the third transistor and the fourth transistor via the coupled node of the gate of the third transistor and the drain of the fourth transistor for gain and secondary phase correction.

The present disclosure describes a correction circuit for correcting imperfect differential signal pairs by feeding back the primary corrected signal pair and performing phase and amplitude correction again. Accordingly, the present disclosure advantageously allows for an improved differential signal pair having the same amplitude but opposite phases to be obtained.

The foregoing is a summary and shall not be construed to limit the scope of the claims. The operations and devices disclosed herein may be implemented in a number of ways, and such changes and modifications may be made without departing from this disclosure and its broader aspects. Other aspects, inventive features, and advantages of the disclosure, as defined solely by the claims, are described in the non-limiting detailed description set forth below.

BRIEF DESCRIPTION OF THE DRAWINGS

FIGS. 4B(a)-(d) depict sequential waveforms of input signals and output signals of a differential signal correction circuit, in accordance with an embodiment of the present disclosure.

FIGS. 4C(a)-(d) depict character charts of a gain error, a phase error, an input matching, and an output matching of a differential signal correction circuit, in accordance with an embodiment of the present disclosure.

DETAILED DESCRIPTION OF EMBODIMENTS

Reference will be made in detail to the present embodiments, examples of which are illustrated in the accompanying drawings. Wherever possible, the same reference numbers are used in the drawings and the description to refer to the same or like parts.

Figure 1A:
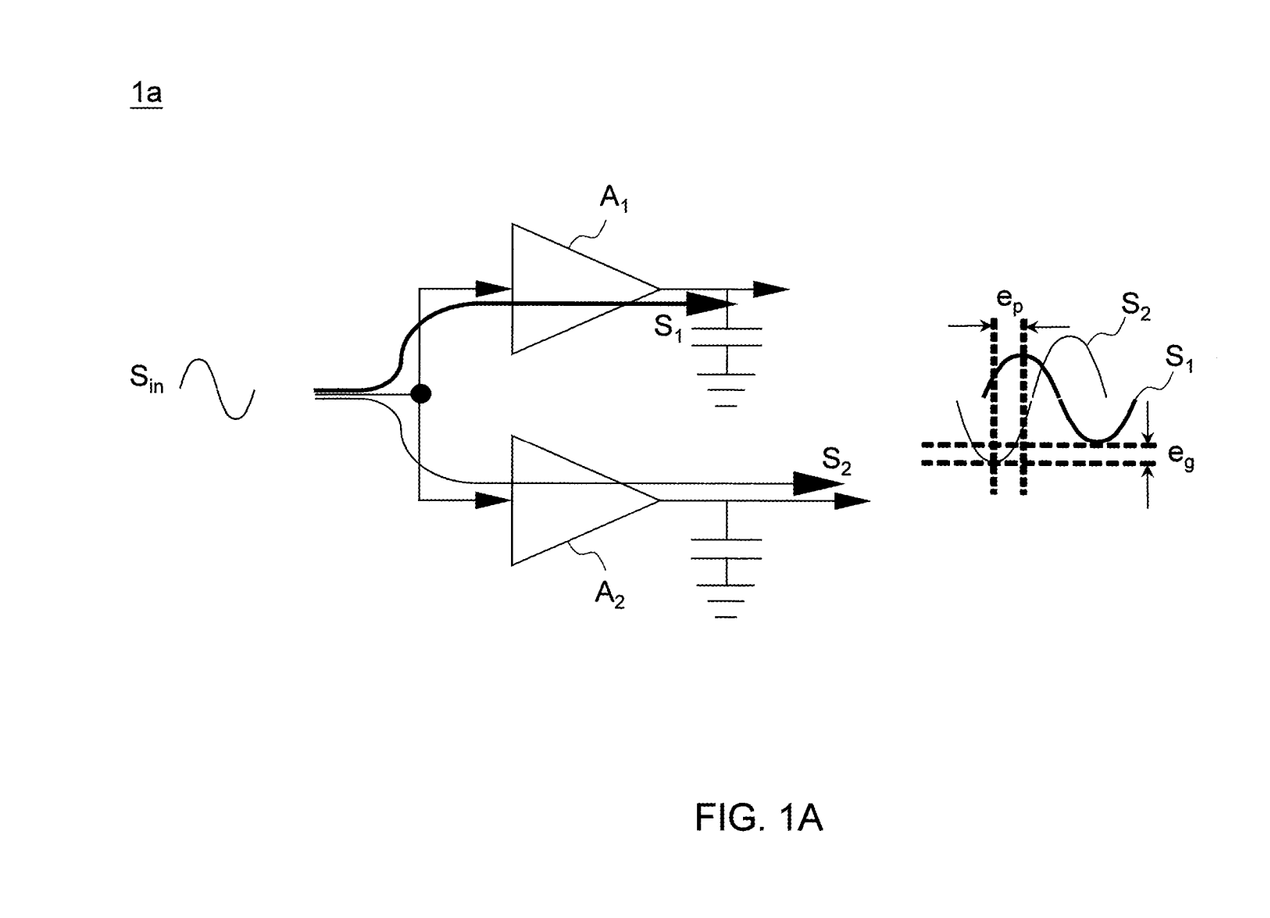
FIG. 1A depicts a conventional differential signal generating circuit.

FIG. 1A depicts a known differential signal generating circuit used in low frequencies. The differential signal generating circuit 1A may include a first amplifier $A_1$ and a second amplifier $A_2$. A sine wave input signal $S_{in}$ may be inputted into both the non-inverting input port of the first amplifier $A_1$ and the inverting input port of the second amplifier $A_2$. After the sine wave input signal $S_{in}$ passes through different paths, a first output signal $S_1$ and a second output signal $S_2$ are obtained. The first output signal $S_1$ and the second output signal $S_2$ may be a differential signal pair that has the same amplitude but a phase difference of 180 degrees. However, a phase error $e_p$ and an amplitude error (i.e. gain error) $e_g$ may occur in the actual output signals.

Figure 1B:
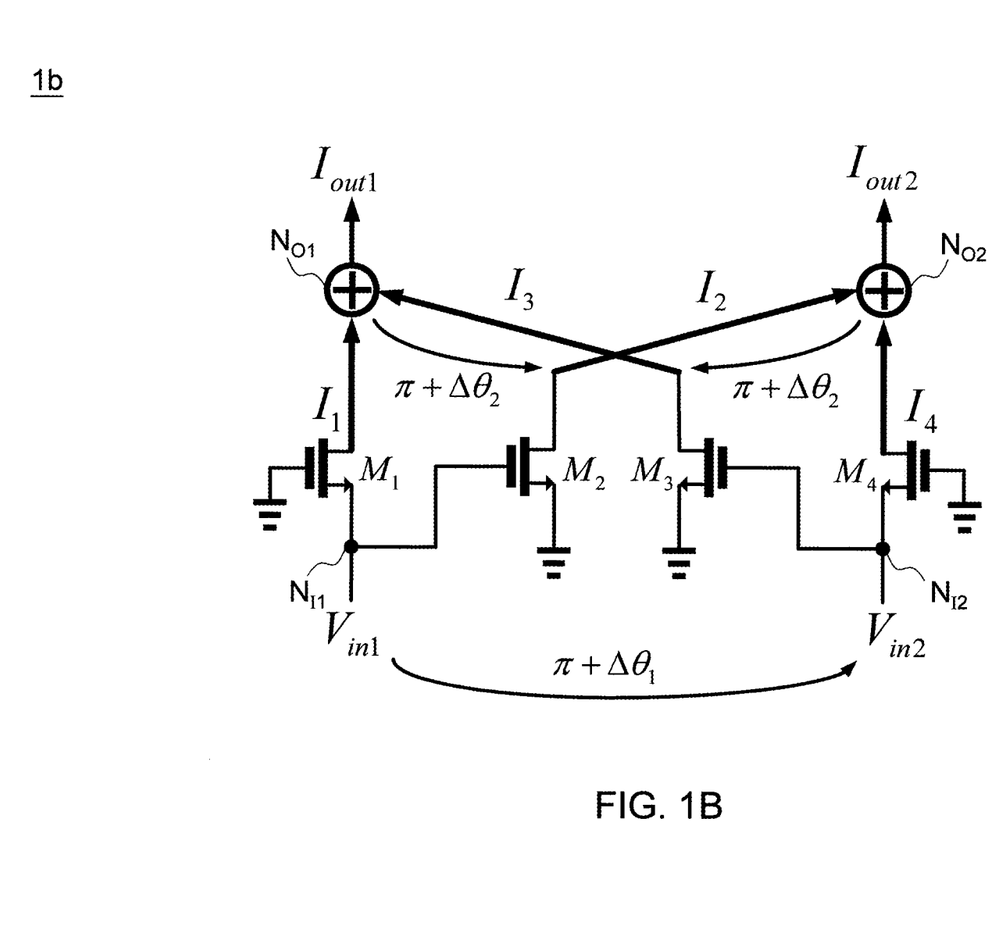
FIG. 1B depicts a known phase correction circuit.

FIG. 1B depicts a known phase correction circuit. The phase correction circuit 1B includes four transistors $M_1$, $M_2$, $M_3$, and $M_4$, wherein the first transistor $M_1$ and the fourth transistor $M_4$ are identical, and the second transistor $M_2$ and the third transistor $M_3$ are identical. The input signals $V_{in1}$ and $V_{in2}$ are inputted into the phase correction circuit 1B through the first input node $N_{I1}$ and the second input node $N_{I2}$, respectively. After the four transistors $M_1$, $M_2$, $M_3$, and $M_4$ apply the phase correction to the input signals $V_{in1}$ and $V_{in2}$, a first output current signal $I_{out1}$ and a second output current signal $I_{out2}$ are obtained from the first output node $N_{O1}$ and the second output node $N_{O2}$, respectively.

One of ordinary skill in the art would appreciate that it may be assumed that the input signals $V_{in1}$ and $V_{in2}$ are the differential signal pair with phase error $\Delta\theta_1$. The phase error $\Delta\theta_2$ may exist between the drain current signal $I_2$ of the second transistor $M_2$ and the drain current signal $I_1$ of the first transistor $M_1$. The phase error $\Delta\theta_2$ may also exist between the drain current signal $I_3$ of the third transistor $M_3$ and the drain current signal $I_4$ of the fourth transistor $M_4$. If the drain current signal $I_1$ of the first transistor $M_1$ is equal to $\sin(\omega t)$, the drain current signal $I_2$ of the second transistor $M_2$ is equal to $-\sin(\omega t+\Delta\theta_2)$, the drain current signal $I_4$ of the fourth transistor $M_4$ is equal to $-\sin(\omega t+\Delta\theta_1)$, and the drain current signal $I_3$ of the third transistor $M_3$ is equal to $\sin(\omega t+\Delta\theta_1+\Delta\theta_2)$, then the first output current signal $I_{out1}$ is equal to $I_1+I_3$ (i.e.

$$I_{out1} = 2\cos\left(\frac{\Delta\theta_1 + \Delta\theta_2}{2}\right) * \sin\left(\omega t + \frac{\Delta\theta_1 + \Delta\theta_2}{2}\right) = g_1 * p)$$

and the second output current signal $I_{out2}$ is equal to $I_2+I_4$ (i.e.

$$I_{out2} = -2\cos\left(\frac{\Delta\theta_1 - \Delta\theta_2}{2}\right) * \sin\left(\omega t + \frac{\Delta\theta_1 + \Delta\theta_2}{2}\right) = g_2 * (-p)).$$

Figure 1C:
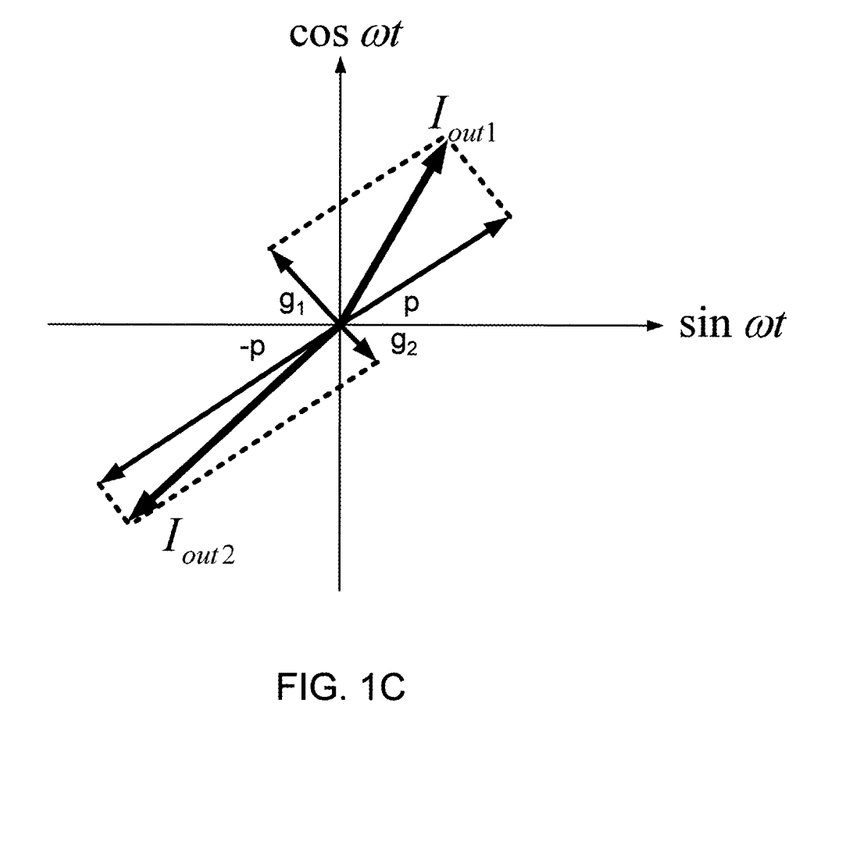
FIG. 1C depicts a vector diagram of a reference first output current signal and a second output current signal on a trigonometric coordinate system.

FIG. 1C depicts the reference first output current signal $I_{out1}$ and the second output current signal $I_{out2}$ on a trigonometric coordinate system. One of ordinary skill in the art would appreciate that the phase components p of $I_{out1}$ and $I_{out2}$ may be substantially different by 180 degrees. Furthermore, the magnitude components $g_1$ and $g_2$ may be different from each other. As a result, the phase of the first output current signal $I_{out1}$ may not be exactly opposite to the phase of the second output current signal $I_{out2}$, and the magnitude of the first output current signal $I_{out1}$ may be different from the magnitude of the second output current signal $I_{out2}$.

The Federal Communications Commission (FCC) has adopted a Report & Order allocating and establishing service rules for the 70, 80 and 90 GHz spectrum bands for use by "millimeter wave" technologies. Such uses may include high-speed, point-to-point wireless local area networks and broadband Internet access. Because of the "pencil-beam" technologies that may be used in this band, no frequency coordination may be used. Instead, each path may be registered in a database which may entitle it to interference protection based upon the date of registration.

The 71-76 GHz and 81-86 GHz bands may each be divided into four unpaired 1.25 gigahertz segments for a total of eight segments. Aggregation of these bands may be permitted. The 92-95 GHz band may be divided into two segments. The FCC will issue an unlimited number of non-exclusive, nationwide licenses authorizing use of the entire 12.9 gigahertz of spectrum in these three bands.

Because of shorter wavelengths, the 71-76, 81-86, and 92-95 GHz bands may permit the use of smaller antennas that would be required in lower bands to achieve the same high directivity and high gain. One consequence of this high directivity, coupled with the high free space loss at these frequencies, may be the possibility of a more efficient use of the spectrum for point-to-multipoint applications. One of ordinary skill in the art would appreciate that since a greater number of high directive antennas can be placed than less directive antennas in a given area, the net result is a higher reuse of the spectrum and a higher density of users than in lower frequencies. One of ordinary skill in the art would further appreciate the affect of the phase error and magnitude error of the differential signal.

Figure 2A:
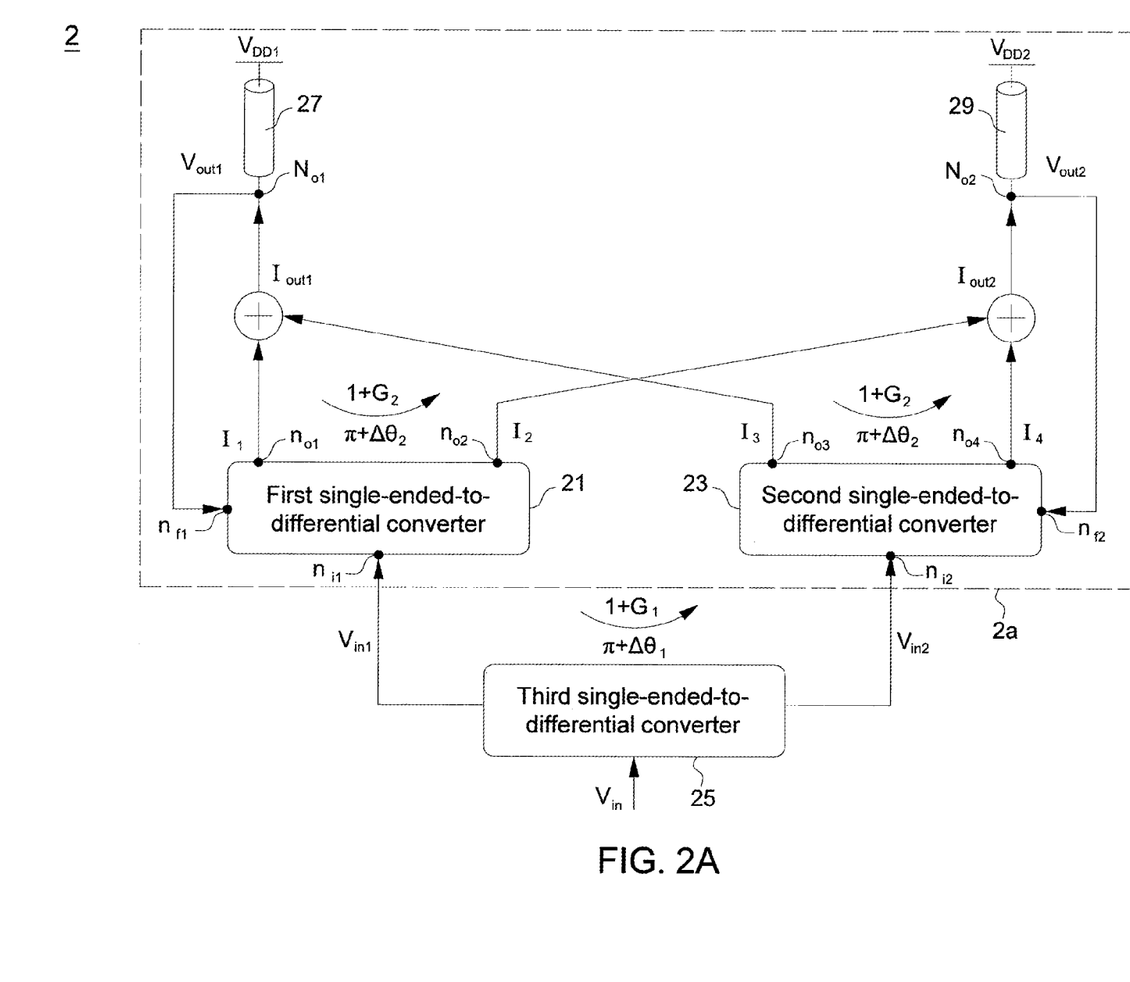
FIG. 2A depicts a block diagram of a correction circuit, in accordance with an embodiment of the present disclosure.

FIG. 2A depicts a block diagram of a correction circuit 2 in accordance with an embodiment of the present disclosure. The correction circuit 2 may comprise a differential signal correction circuit 2a and a third single-ended-to-differential converter 25 coupled with the differential signal correction circuit 2a. The differential signal correction circuit 2a may comprise a first single-ended-to-differential converter 21, a second single-ended-to-differential converter 23, a first load 27, and a second load 29.

In an embodiment, the first single-ended-to-differential converter 21 and the second single-ended-to-differential converter 23 may be identical. As one of ordinary skill in the art would appreciate, the first single-ended-to-differential converter 21 and the second single-ended-to-differential converter 23 may comprise the same devices and the same connecting relationship between the devices. The first load 27 and the second load 28 may be identical, and the first load 27 and the second load 28 may be active devices or passive devices, such as transistors, resistors, capacitors, inductances, or transmission lines. The first single-ended-to-differential converter 21 may have a first input port $n_{i1}$, a first output port $n_{o1}$, a second output port $n_{o2}$ and a first feedback port $n_{f1}$. The second single-ended-to-differential converter 23 may have a second input port $n_{i2}$, a third output port $n_{o3}$, a fourth output port $n_{o4}$, and a second feedback port $n_{f2}$. The first output port $n_{o1}$ and the third output port $n_{o3}$ may be coupled with a first output node $N_{O1}$, the second output port $n_{o2}$, and the fourth output port $n_{o4}$ may be coupled with a second output node $N_{O2}$. The first feedback port $n_{f1}$ may be coupled with the first output node $N_{O1}$ and the second feedback port $n_{f2}$ may be couple with the second output node $N_{O2}$. In practice, the first feedback port $n_{f1}$ may be coupled with the first output port $n_{o1}$, and the second feedback port $n_{f2}$ may be coupled with the fourth output port $n_{o4}$.

The first load 27 may be coupled between the first output node $N_{O1}$ and a first power source $V_{DD1}$. The second load 29 may be coupled between the second output node $N_{O2}$ and a second power source $V_{DD2}$. In practice, the first power source $V_{DD1}$ and the second power source $V_{DD2}$ may be the same power source.

The third single-ended-to-differential converter 25 may be configured to receive an input signal $V_{in}$ and convert the input signal $V_{in}$ into a first input signal $V_{in1}$ and a second input signal $V_{in2}$. The first input signal $V_{in1}$ and the second input signal $V_{in2}$ may be a differential signal pair having phase error $\Delta\theta_1$ and gain error $G_1$. The first input signal $V_{in1}$ from the third single-ended-to-differential converter 25 may be received by the first single-ended-to-differential converter 21 via the first input port $n_{i1}$. The second input signal $V_{in2}$ from the third single-ended-to-differential converter 25 may be received by the second single-ended-to-differential converter 23 via the second input port $n_{i2}$.

The first single-ended-to-differential converter 21 may convert the first input signal $V_{in1}$ into a first current signal $I_1$ and a second current signal $I_2$, in which the first current signal $I_1$ and the second current signal $I_2$ may be a differential signal pair with phase error $\Delta\theta_2$ and gain error $G_2$. The first current signal $I_1$ may be outputted from the first output port $n_{o1}$ to the first output node $N_{O1}$. The second current signal $I_2$ may be outputted from the second output port $n_{o2}$ to the second output node $N_{O2}$.

The second single-ended-to-differential converter 23 may convert the second input signal $V_{in2}$ into a third current signal $I_3$ and a fourth current signal $I_4$, in which the third current signal $I_3$ and the fourth current signal $I_4$ may be a differential signal pair having phase error $\Delta\theta_2$ and gain error $G_2$. The third current signal $I_3$ may be outputted from the third output port $n_{o3}$ to the first output node $N_{O1}$. The fourth current signal $I_4$ may be outputted from the fourth output port $n_{o4}$ to the second output node $N_{O2}$.

A first output current signal $I_{out1}$ may be collected from the first current signal $I_1$ and the third current signal $I_3$ at the first output node $N_{O1}$. The first output current signal $I_{out1}$ may also be presented in an equation: $I_{out1}=I_1+I_3$. A second output current signal $I_{out2}$ may be collected from the second current signal $I_2$ and the fourth current signal $I_4$ at the second output node $N_{O2}$. The second output current signal $I_{out2}$ may also be presented in an equation: $I_{out2}=I_2+I_4$. Based on above-mentioned related art, the first output current signal $I_{out1}$ and the second output current signal $I_{out2}$ may be corrected signals of the first input signal $V_{in1}$ that is phase corrected by the first single-ended-to-differential converter 21, and the corrected signal of the second input signal $V_{in2}$ that is phase corrected by the second single-ended-to-differential converter 23, respectively.

The first load 27 may convert the first output current signal $I_{out1}$ from the first output node $N_{O1}$ into a first output voltage signal $V_{out1}$. The first output voltage signal $V_{out1}$ may fed back to the first single-ended-to-differential converter 21 via the first feedback port $n_{f1}$ (i.e. the first output port $n_{o1}$). Accordingly, its amplitude and secondary phase may be corrected by the first single-ended-to-differential converter 21. The second load 29 may convert the second output current signal $I_{out2}$ from the second output node $N_{O2}$ into a second output voltage signal $V_{out2}$. The second output voltage signal $V_{out2}$ may be fed back to the second single-ended-to-differential converter 23 via the second feedback port $n_{f2}$ (i.e. the fourth output port $n_{o4}$). Accordingly, its amplitude and secondary phase may be corrected by the second single-ended-to-differential converter 23. The amplitude and secondary phase correction will be described hereafter.

Figure 2B:
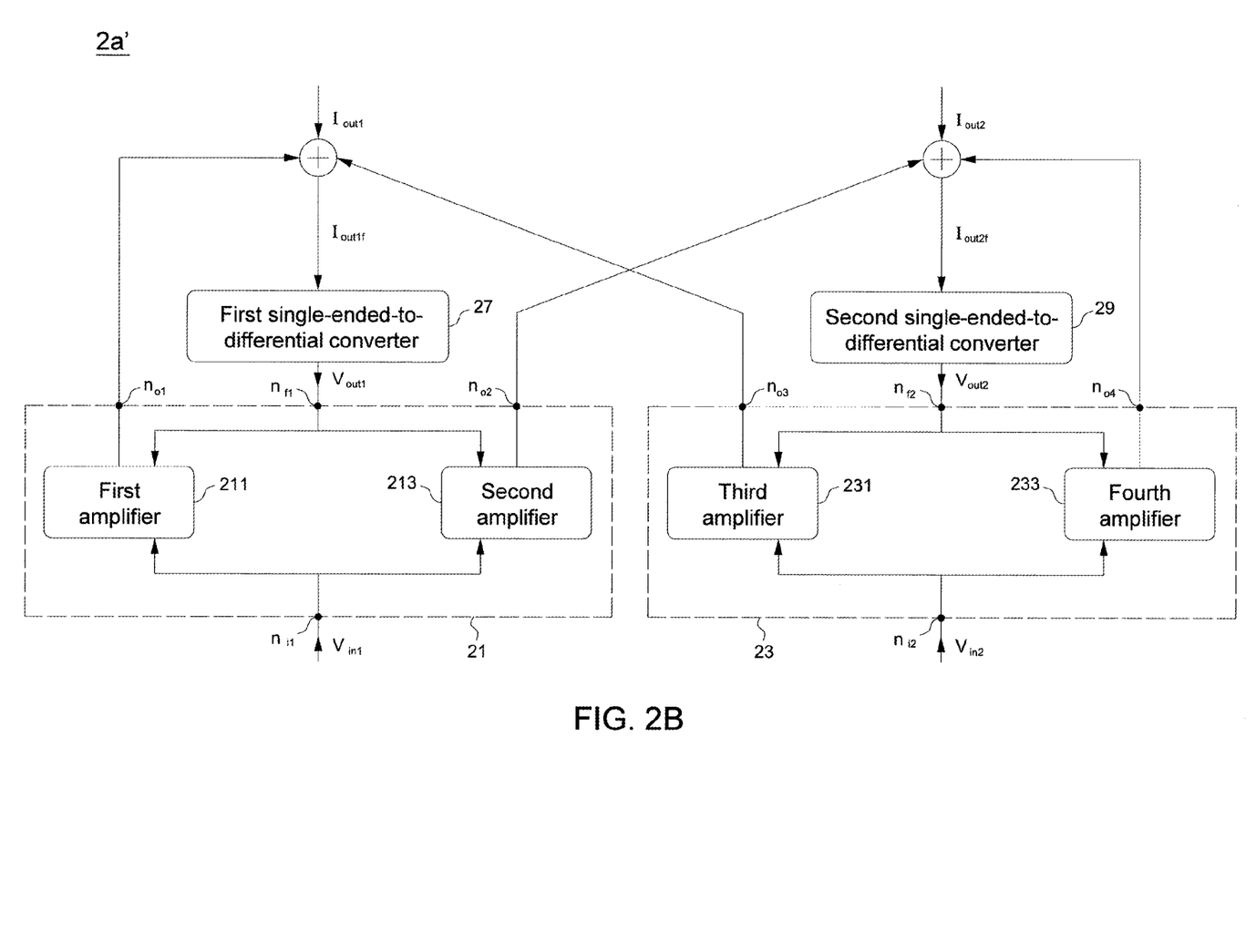
FIG. 2B depicts a block diagram of a differential signal correction circuit, in accordance with an embodiment of the present disclosure.

FIG. 2B depicts a block diagram of a differential signal correction circuit 2a' in accordance with an embodiment of the present disclosure. One of ordinary skill in the art would appreciate that the differential signal correction circuit 2a' as shown in FIG. 2B indicates the input and output of signals, which may not be entirely dependent on the connecting relationships of the devices. In an embodiment, the first single-ended-to-differential converter 21 may comprise a first amplifier 211 and a second amplifier 213, and the second single-ended-to-differential converter 23 may comprise a third amplifier 231 and a fourth amplifier 233. The first amplifier 211, the second amplifier 213, the third amplifier 231 and the fourth amplifier 233 may be devices having three terminals, such as N-channel metal-oxide semiconductor field-effect transistors, SiGe transistors, hetero-junction bipolar transistors (HBT), or bipolar junction transistors. One of ordinary skill in the art would appreciate that the amplifiers 211, 213, 231 and 233 are not restricted by the above-mentioned transistors.

The first amplifier 211 may be coupled between the first input port $n_{i1}$ the first output port $n_{o1}$. The second amplifier 213 may be coupled between the first input port $n_{i1}$ and the second output port $n_{o2}$. Further, the first amplifier 211 and the second amplifier 213 may be coupled with the first feedback port $n_{f1}$ (i.e. the first output port $n_{o1}$). The third amplifier 231 may be coupled between the second input port $n_{i2}$ and the third output port $n_{o3}$. The fourth amplifier 233 may be coupled between the second input port $n_{i2}$ and the fourth output port $n_{o4}$. Further, the third amplifier 231 and the fourth amplifier 233 may be coupled with the second feedback port $n_{f2}$ (i.e. the fourth output port $n_{o4}$).

One of ordinary skill in the art would appreciate that it may be assumed that an amplification of the first amplifier 211 may be equal to $\beta_{n1}$, an amplification of the second amplifier 213 may be equal to $\beta_{p1}$, an amplification of the third amplifier 231 may be equal to $\beta_{p2}$, an amplification of the fourth amplifier 233 may be equal to $\beta_{n2}$, a resistance of the first load 27 may be equal to $A_1$, and an resistance of the second load 29 may be equal to $A_2$. Because the first single-ended-to-differential converter 21 and the second single-ended-to-differential converter 23 are identical, the amplification of the first amplifier 211 may be equal to the amplification of the fourth amplifier 233. It may also be presented in an equation: $\beta_{n1}=\beta_{n2}=\beta_n$, in which $\beta_n$ is a first amplification. Also, the amplification of the second amplifier 213 may be equal to the amplification of the third amplifier 231. It may also be presented in an equation: $\beta_{p1}=\beta_{p2}=\beta_p$, in which $\beta_p$ is a second amplification. Because the first load 27 and the second load 29 are identical, the resistance may also be presented in an equation: $A_1=A_2=A$. The corrected signals comprising the first output voltage signal $V_{out1}$ and the second output voltage signal $V_{out2}$ may be presented as follows:

$$V_{out1} = A_1(I_{out1} - \beta_{p2}V_{out2} - \beta_{n1}V_{out1}) \qquad (1)$$
$$= A(I_{out1} - \beta_p V_{out2} - \beta_n V_{out1})$$

$$V_{out2} = A_2(I_{out2} - \beta_{p1}V_{out1} - \beta_{n2}V_{out2}) \qquad (2)$$
$$= A(I_{out2} - \beta_p V_{out1} - \beta_n V_{out2})$$

The first output voltage signal $V_{out1}$ and the second output voltage signal $V_{out2}$ may be presented with respect to the first output current signal $I_{out1}$ and the second output current signal $I_{out2}$ by the equation (1) and the equation (2) as follows:

$$V_{out1} = \frac{1}{\left[\left(\frac{1}{A}+\beta_n\right)^2-\beta_p^2\right]}\left[\left(\frac{1}{A}+\beta_n\right)I_{out1}-\beta_p I_{out2}\right] \qquad (3)$$

$$V_{out2} = \frac{-1}{\left[\left(\frac{1}{A}+\beta_n\right)^2-\beta_p^2\right]}\left[\beta_p I_{out1}-\left(\frac{1}{A}+\beta_n\right)I_{out2}\right] \qquad (4)$$

Based on equation (3) and equation (4), if the first amplification $\beta_n$ and the second amplification $\beta_p$ are set up as $$\beta_p = \left(\frac{1}{A}+\beta_n\right),$$

then the first output voltage signal $V_{out1}$ and the second output voltage signal $V_{out2}$ may be presented as $V_{out1}=-V_{out2}$. As a result, the first output voltage signal $V_{out1}$ and the second output voltage signal $V_{out2}$ are a differential signal pair having opposite phases but the same amplitude. In practice, the first amplification $\beta_n$ and the second amplification $\beta_p$ may be designated as $$\beta_p \leq \left(\frac{1}{A}+\beta_n\right).$$

Accordingly, the first output voltage signal $V_{out1}$ and the second output voltage signal $V_{out2}$ may be an acceptable differential signal pair.

Figure 2C:
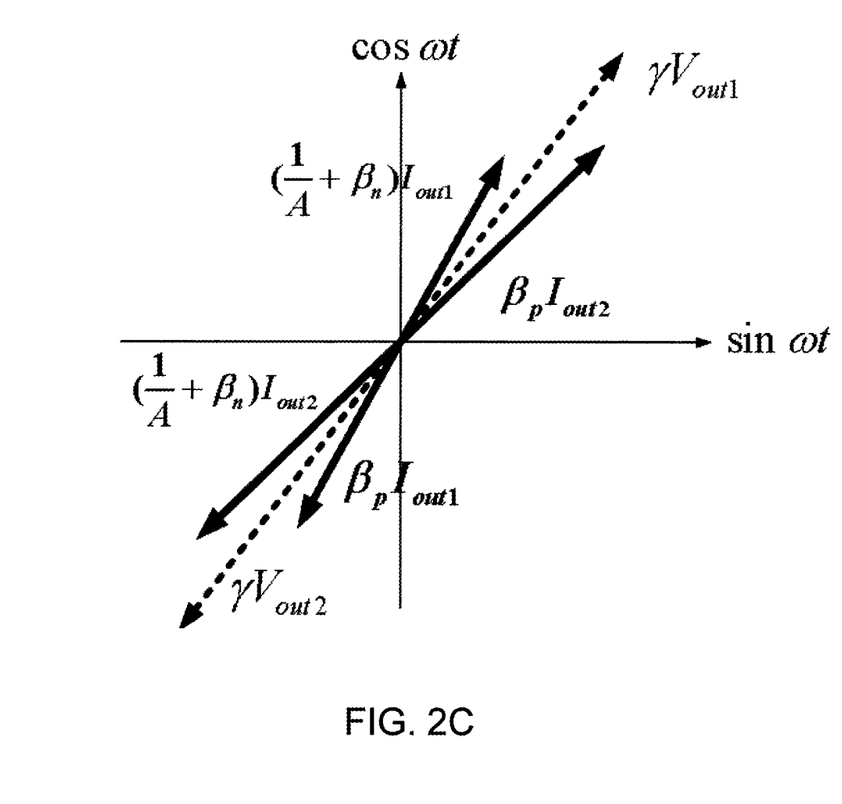
FIG. 2C depicts a vector diagram of a first voltage signal and a second voltage signal on a trigonometric coordinate system, in accordance with an embodiment of the present disclosure.

FIG. 2C depicts a vector diagram of the first voltage signal $V_{out1}$ and the second voltage signal $V_{out2}$ on a trigonometric coordinate system. As shown in FIG. 2C, the vector $\gamma V_{out1}$ and the vector $\gamma V_{out2}$ have the same amplitude but opposite directions. The coefficient $\gamma$ may be presented as $$\gamma = \left(\frac{1}{A}+\beta_n\right)^2-\beta_p^2.$$

In a traditional circuit, the first output voltage signal $V_{out1}$ and the second output voltage signal $V_{out2}$ are not fed back into the first single-ended-to-differential converter 21 and the second single-ended-to-differential converter 23, respectively. The first output voltage signal $V_{out1}$ and the second output voltage signal $V_{out2}$ may be presented with respect to the first output current signal $I_{out1}$ and the second output current signal $I_{out2}$ as $V_{out1}+V_{out2}=A(I_{out1}+I_{out2})$. Compared with traditional circuits without feedback, the first output voltage signal $V_{out1}$ and the second output voltage signal $V_{out2}$ are fed back and corrected by the differential signal correction circuit 2a' again. The corrected first output voltage signal $V_{out1}$ and the corrected second output voltage signal $V_{out2}$ may be presented by the following equation (5):

$$V_{out1}+V_{out2} = \frac{1}{\left[\left(\frac{1}{A}+\beta_n\right)^2-\beta_p^2\right]}\left[\left(\frac{1}{A}+\beta_n-\beta_p\right)I_{out1}+\left(\frac{1}{A}+\beta_n-\beta_p\right)I_{out2}\right] \qquad (5)$$
$$= \frac{1}{\left[\left(\frac{1}{A}+\beta_n+\beta_p\right)\left(\frac{1}{A}+\beta_n-\beta_p\right)\right]}\left[\left(\frac{1}{A}+\beta_n-\beta_p\right)I_{out1}+\left(\frac{1}{A}+\beta_n-\beta_p\right)I_{out2}\right]$$
$$= \frac{1}{\left(\frac{1}{A}+\beta_n+\beta_p^2\right)}[I_{out1}+I_{out2}]$$

Accordingly, the gain error of the output voltage signals may be reduced from A to $$\frac{1}{\left(\frac{1}{A}+\beta_n+\beta_p\right)}$$

after correction via the differential signal correction circuit 2a'. Therefore, the gain error factor $G_F$ may be presented as $$G_F = \frac{1}{(1+A\beta_n+A\beta_p)}.$$

Figure 3:
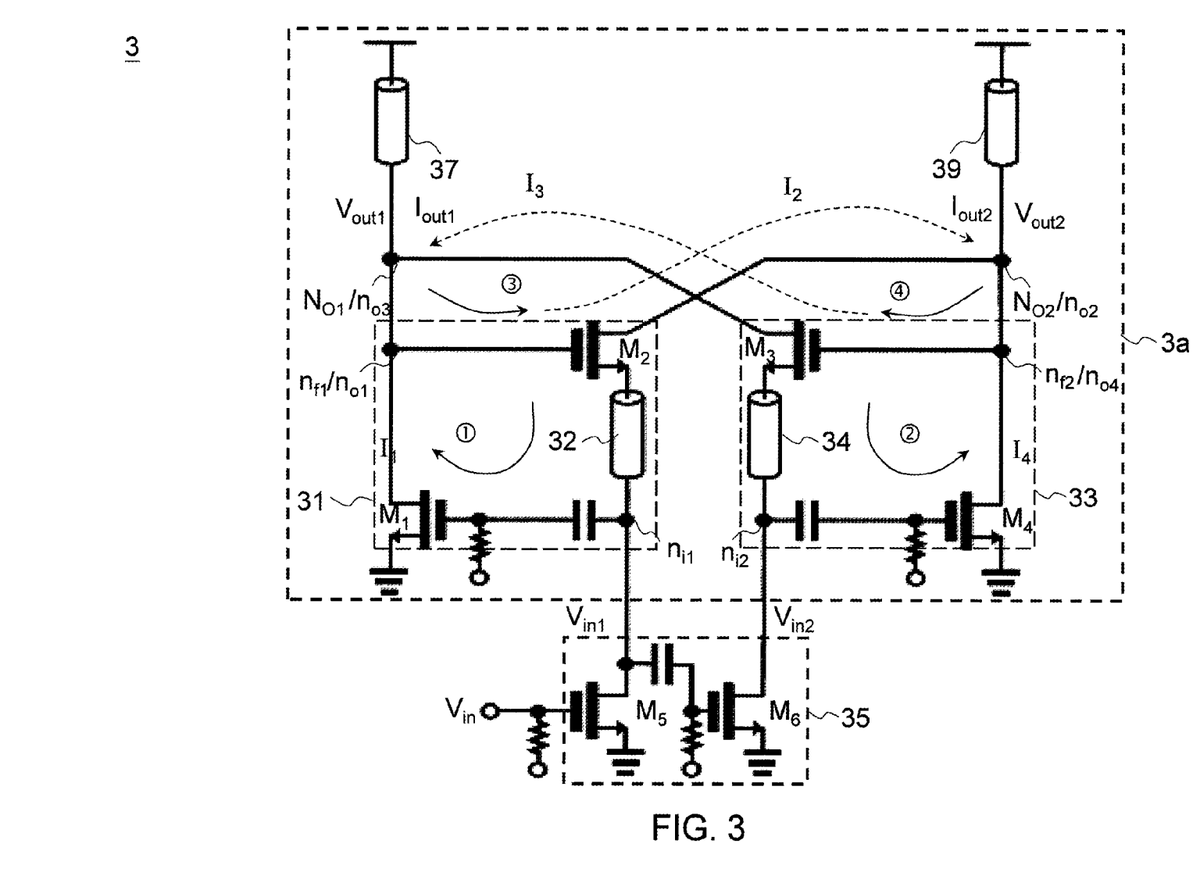
FIG. 3 depicts a circuit diagram of a correction circuit, in accordance with an embodiment of the present disclosure.

FIG. 3 depicts a circuit diagram of a correction circuit 3 in accordance with an embodiment of the present disclosure. The correction circuit 3 of FIG. 3 shows the devices in the differential signal correction circuit 3a and the third single-ended-to-differential converter 35. The first single-ended-to-differential converter 31 may comprise a first transistor $M_1$ regarded as the first amplifier, and a second transistor $M_2$ regarded as the second amplifier. The second single-ended-to-differential converter 33 may comprise a third transistor regarded $M_3$ as the third amplifier, and a fourth transistor $M_4$ regarded as the fourth amplifier. The third single-ended-to-differential converter 35 may comprise a fifth transistor $M_5$ and a sixth transistor $M_6$.

An input signal $V_{in}$ may be inputted into the third single-ended-to-differential converter 35 via the gate of the fifth transistor $M_5$. The source of the fifth transistor $M_5$ and the source of the sixth transistor $M_6$ may be grounded. The gate of the sixth transistor $M_6$ may be coupled with the drain of the fifth transistor $M_5$. The differential signal pair may comprise a first input signal $V_{IN1}$ and a second input signal $V_{in2}$. The differential signal pair may be obtained after the input signal $V_{in}$ is amplified by the fifth transistor $M_5$ and the sixth transistor $M_6$. The first input signal $V_{in1}$ may be outputted from the drain of the fifth transistor $M_5$ to a first input port $n_{i1}$ of the differential signal correction circuit 3a. The second input signal $V_{in2}$ may be outputted from the drain of the sixth transistor $M_6$ to a second input port $n_{i2}$ of the differential signal correction circuit 3a.

The gate of the first transistor $M_1$ and the source of the second transistor $M_2$ may be connected to the first input port $n_{i1}$. The drain of the first transistor $M_1$ and the gate of the second transistor $M_2$ may be connected to the first output port $n_{o1}$. The drain of the second transistor $M_2$ may be connected to the second output port $n_{o2}$. The first output port $n_{o1}$ may be connected to the first output node $N_{O1}$. The second output port $n_{o2}$ may be connected to the second output node $N_{O2}$.

The gate of the fourth transistor $M_4$ and the source of the third transistor $M_3$ may be connected to the second input port $n_{i2}$. The drain of the fourth transistor $M_4$ and the gate of the third transistor $M_3$ may be connected to the fourth output port $n_{o4}$. The drain of the third transistor $M_3$ may be connected to the third output port $n_{o3}$. The fourth output port $n_{o4}$ may be connected to the second output node $N_{O2}$. The third output port $n_{o3}$ may be connected to the first output node $N_{O1}$. The first load 37 may be connected between the first output node $N_{O1}$ and a power source. The second load 39 may be connected between the second output node $N_{O2}$ and a power source.

A first current signal $I_1$ and a second current signal $I_2$ may be obtained after the first input signal $V_{in1}$ is amplified by the first transistor $M_1$ and the second transistor $M_2$. A third current signal $I_3$ and a fourth current signal $I_4$ may be obtained after the second input signal $V_{in2}$ is amplified by the third transistor $M_3$ and the fourth transistor $M_4$. A first output current signal $I_{out1}$ may be collected from the first current signal $I_1$ and the third current signal $I_3$ at the first output node $N_{O1}$. A second output current signal $I_{out2}$ may be collected from the second current signal $I_2$ and the fourth current signal $I_4$ at the second output node $N_{O2}$. Accordingly, the first input signal $V_{in1}$ may be phase corrected by the first transistor $M_1$ and the second transistor $M_2$, and the second input signal $V_{in2}$ may be phase corrected by the third transistor $M_3$ and the fourth transistor $M_4$.

One of ordinary skill in the art would appreciate that one technical feature of an embodiment of the present disclosure lies in the connecting relationship and the parameter design of the of the transistors $M_1$, $M_2$, $M_3$, and $M_4$. The parameters may be the bias levels and the amplifications of the transistors $M_1$, $M_2$, $M_3$, and $M_4$. In particular, the amplification of the first transistor $M_1$ and the fourth transistor $M_4$ may be designed to be equal to a first amplification $\beta_n$, and the amplification of the second transistor $M_2$ and the third transistor $M_3$ may be designed to be equal to a second amplification $\beta_p$, in which the relationship of the first amplification $\beta_n$, the second amplification $\beta_p$ and the resistance A of the first load 34 and the second load 39 may be presented as $$\beta_p \leq \left(\frac{1}{A} + \beta_n\right);$$

for well phase and gain (amplitude) correction.

The first output current signal $I_{out1}$ may be converted into a first output voltage signal $V_{out1}$ by the first load 37. The second output current signal $I_{out2}$ may be converted into a second output voltage signal $V_{out2}$ by the second load 39. The first output voltage signal $V_{out1}$ may be fed back to the first single-ended-to-differential converter 31 via the first output node $N_{O1}$. The second output voltage signal $V_{out2}$ may be fed back to the second single-ended-to-differential converter 33 via the second output node $N_{O2}$.

The first output voltage signal $V_{out1}$ may be amplified by the second transistor $M_2$ and outputted to the second output node $N_{O2}$ along a positive feedback path ③, in the meantime, the first output voltage signal $V_{out1}$ may be amplified by the first transistor $M_1$ and outputted to the first output node $N_{O1}$ along a negative feedback path ①. The second output voltage signal $V_{out2}$ may be amplified by the fourth transistor $M_4$ and outputted to the second output node $N_{O2}$ along a negative feedback path ②, in the meantime, the second output voltage signal $V_{out2}$ may be amplified by the third transistor $M_3$ and outputted to the first output node $N_{O1}$ along a positive feedback path ④. A differential signal pair having the same amplitude but a phase difference of 180 degrees may be obtained after the first output voltage signal $V_{out1}$ and the second output voltage signal $V_{out2}$ are phase and gain corrected during feedback.

In an embodiment, the differential signal correction circuit 3a may further comprise a third load 37 and a fourth load 34. The third load 32 and the fourth load 34 may be active devices or passive devices, such as transistors, resistors, capacitors, inductances or transmission lines. The third load 32 may be connected between the first input port $n_{i1}$ and the source of the second transistor $M_2$. The fourth load 34 may be connected between the second input port $n_{i2}$ and the source of the third transistor $M_3$. Accordingly, the transistors $M_1$, $M_2$, $M_3$, and $M_4$ may be operated with well impedance matching at high frequency.

Figure 4A:
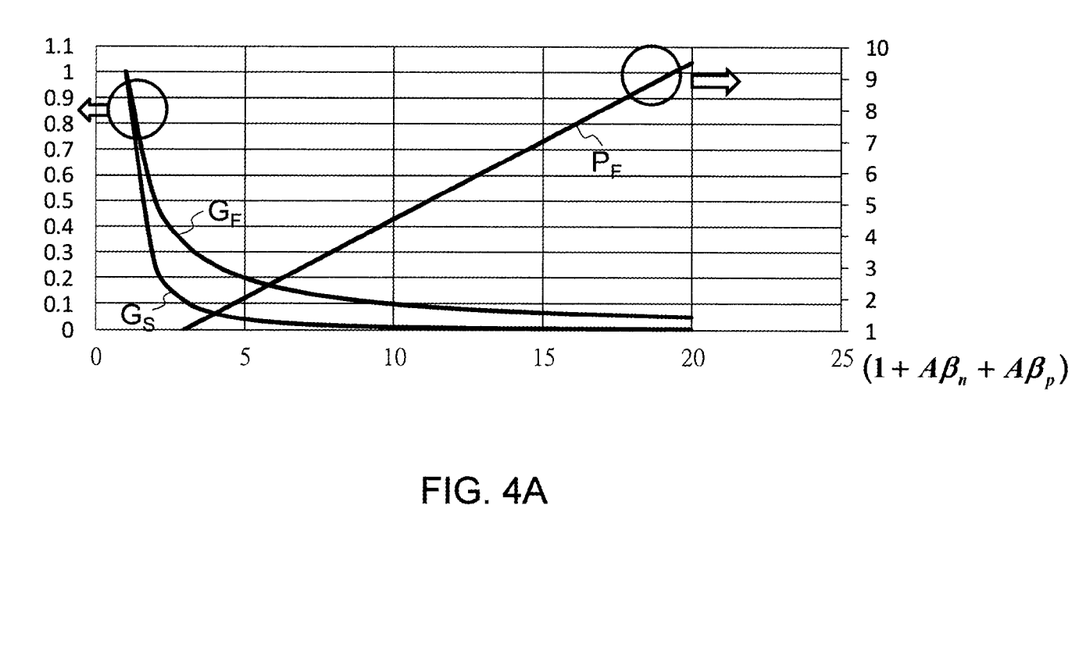
FIG. 4A depicts a character chart of a power factor, a gain error factor, and a gain error sensitivity of a differential signal correction circuit, in accordance with an embodiment of the present disclosure.
Figure 4B:
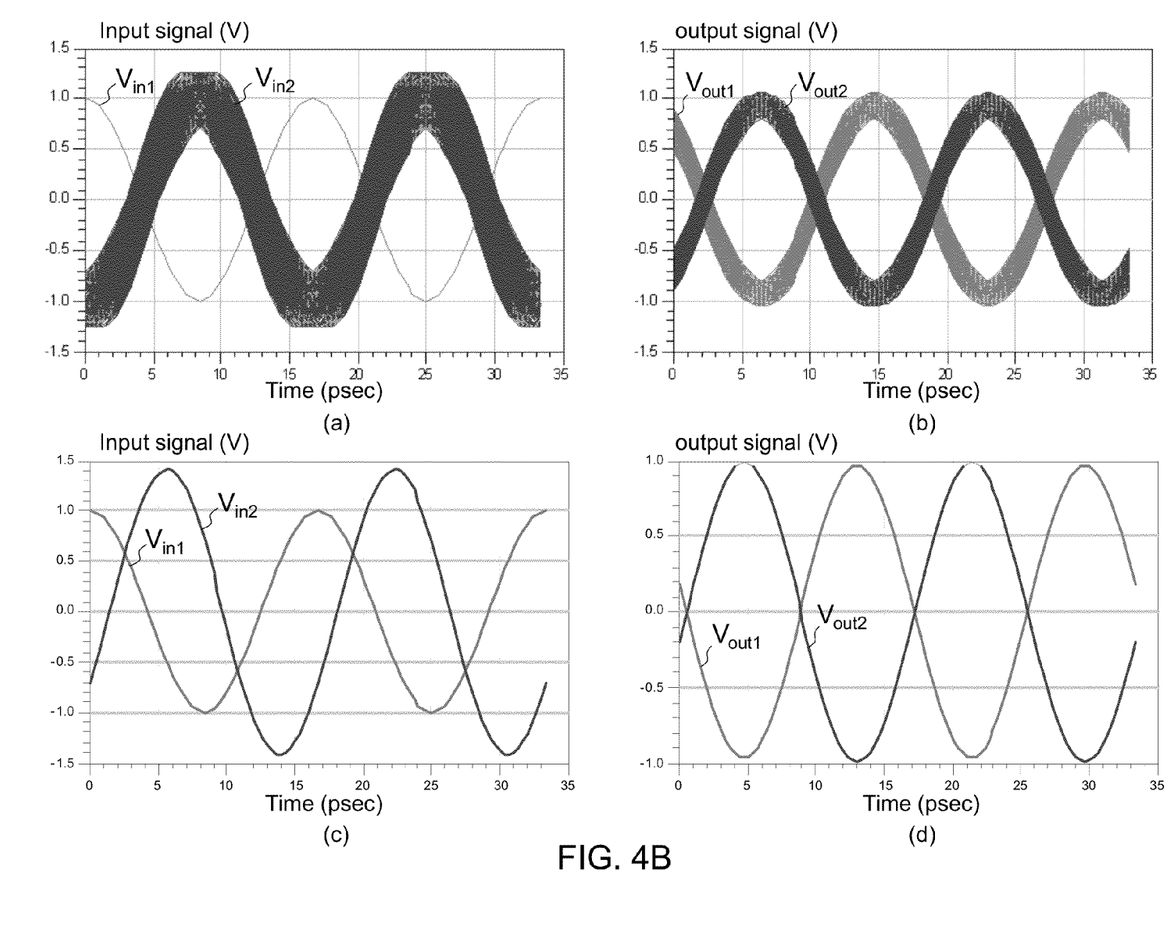
Figure 4C:
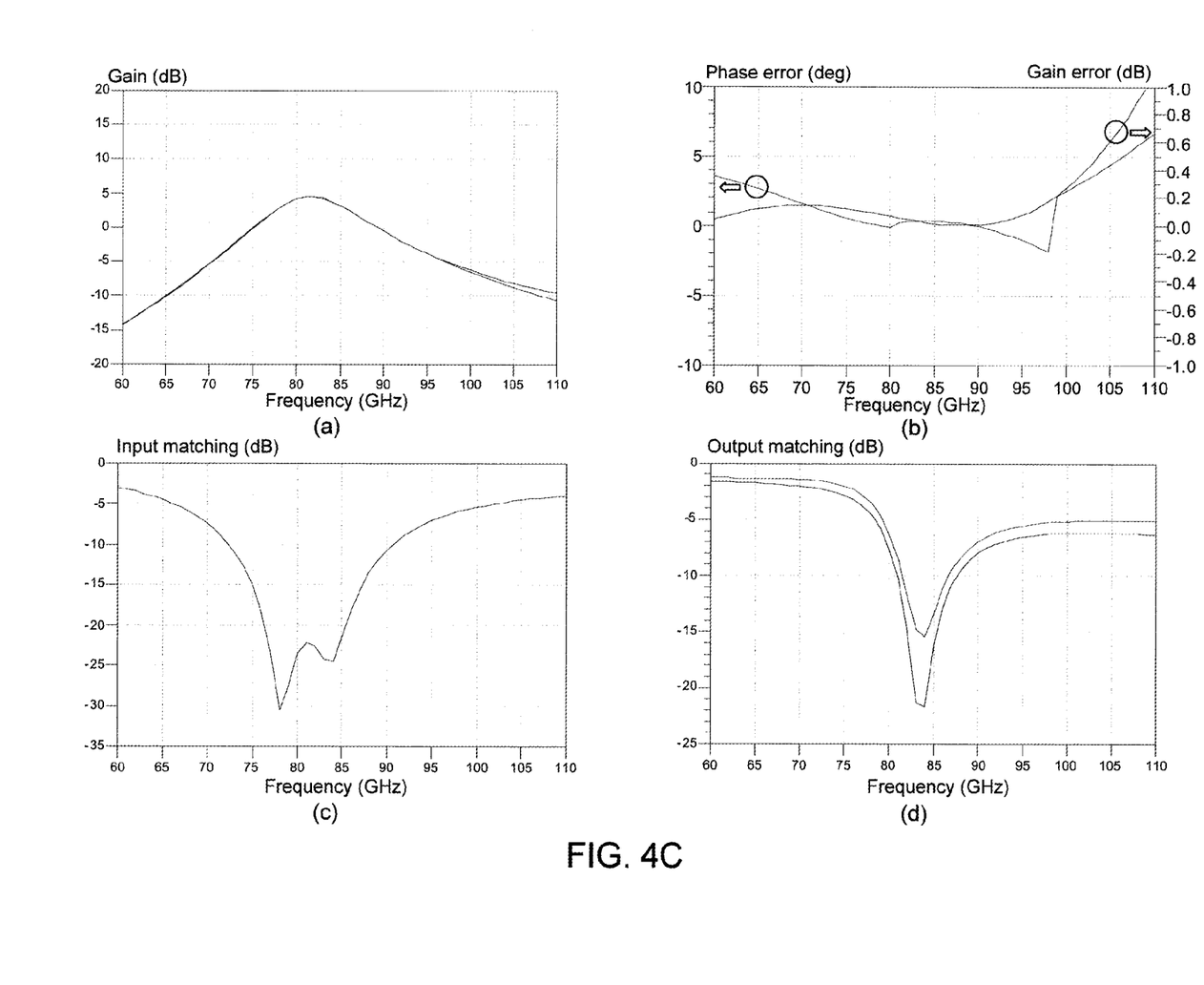

FIG. 4A depicts a simulated character chart of a power factor $P_F$, a gain error factor $G_F$ and a gain error sensitivity $G_S$ of a differential signal correction circuit in accordance with an embodiment of the present disclosure. As shown in FIG. 4A, the power factor $P_F$ increases with increasing of the reciprocal of the gain error factor $(1+A\beta_n+A\beta_p)$. In particular, when the reciprocal of the gain error factor $(1+A\beta_n+A\beta_p)$ is equal to 5~6 approximately, the gain error factor $G_F$ and the gain error sensitivity $G_S$ may be substantially low.

FIG. 4B(a)-(d) are simulated sequential waveforms of input signals $V_{in1}$ and $V_{in2}$ and output signals $V_{out1}$ and $V_{out2}$ of a differential signal correction circuit in accordance with an embodiment of the present disclosure. As depicted in FIG. 4B(a), the first input signal and the second input signal have a phase error of 25 degrees (i.e. $\Delta\theta_1 = \pm 25°$ and a gain error of 2 dB (i.e. $G_1=\pm 2$ dB). FIG. 4B(b) depicts the output voltages $V_{out1}$ and $V_{out2}$ corresponding to the input signals $V_{in1}$ and $V_{in2}$ of FIG. 4B(a). The output voltages $V_{out1}$ and $V_{out2}$ may have the same amplitude but opposite phases.

As depicted in FIG. 4B(c), the first input signal and the second input signal have a phase error of 60 degrees (i.e. $\Delta\theta_1=)\pm 60°$ and a gain error of 3 dB (i.e. $G_1=\pm 3$ dB). FIG. 4B(d) depicts the output voltages $V_{out1}$ and $V_{out2}$ corresponding to the input signals $V_{in1}$ and $V_{in2}$ of FIG. 4B(c). The output voltages $V_{out1}$ and $V_{out2}$ have the same amplitude but opposite phases.

FIG. 4C(a)-(d) depict simulated character charts of a gain error, a phase error, an input matching, and an output matching of a differential signal correction circuit in accordance with an embodiment of the present disclosure. As depicted in FIG. 4C(a), when the differential signal correction circuit is operated at frequency of about 83 GHz, the gain may be approximately equal to 4.246 dB. As shown in FIG. 4C(b), when the differential signal correction circuit is operated at frequency of about 83 GHz, the phase error may be approximately equal to 0.32 degrees and the gain error may be approximately equal to 0.034 dB. As shown in FIG. 4C(c), when the differential signal correction circuit is operated at frequency of about 83 GHz, the input matching may be about 24.134 dB. As shown in FIG. 4C(d), when the differential signal correction circuit is operated at frequency of about 83 GHz, the output matching may be about 14.821 dB and 21.217 dB.

At least one advantage of the correction circuit described herein is to allow a differential signal correction circuit to use fewer transistors to accomplish simultaneous phase and gain correction while occupying a small area. Moreover, the differential signal correction circuit may be accepted for correcting differential signals at any frequency band, even at W-band frequency, which still has well correcting effects. As a result, the differential signal correction circuit of the present disclosure may be suitable for RF circuit system and may be capable of raising system performance.

Realizations in accordance with the present disclosure have been described in the context of particular embodiments. These embodiments are meant to be illustrative and not limiting. Many variations, modifications, additions, and improvements are possible. Accordingly, plural instances may be provided for components described herein as a single instance. Structures and functionality presented as discrete components in the exemplary configurations may be implemented as a combined structure or component. These and other variations, modifications, additions, and improvements may fall within the scope of the disclosure as defined in the claims that follow.

What is claimed is:

1. A differential signal correction circuit, comprising:
   a first single-ended-to-differential converter having a first input port, a first output port and a second output port, wherein the first output port is coupled with a first output node, the second output port is coupled with a second output node, the first input port is configured to receive a first input signal, the first single-ended-to-differential converter is configured to convert the first input signal into a first current signal and a second current signal, the first current signal is outputted from the first output port, and the second current signal is outputted from the second output port;
   a second single-ended-to-differential converter having a second input port, a third output port and a fourth output port, wherein the third output port is coupled with the first output node, the fourth output port is coupled with the second output node, the second input port is configured to receive a second input signal, the second input signal and the first input signal are differential signal pair, the second single-ended-to-differential converter is configured to convert the second input signal into a third current signal and a fourth current signal, the third current signal is outputted from the third output port, and fourth current signal is outputted from the fourth output port;
   a first load coupled between the first output node and a first power source, wherein the first load is configured to convert a first output current signal collected from the first current signal and the third current signal at the first output node into a first output voltage signal, and the first output voltage signal is fed back to the first single-ended-to-differential converter for phase and gain correction; and
   a second load coupled between the second output node and a second power source, wherein the second load is configured to convert a second output current signal collected from the second current signal and the fourth current signal at the second output node into a second output voltage signal, and the second output voltage signal is fed back to the second single-ended-to-differential converter for phase and gain correction.

2. The circuit according to claim 1, wherein the first single-ended-to-differential converter includes a first amplifier and a second amplifier, the first amplifier is coupled between the first input port and the first output port, and the second amplifier is coupled between the first output port and the second output port.

3. The circuit according to claim 2, wherein the second single-ended-to-differential converter includes a third amplifier and a fourth amplifier, the third amplifier is coupled between the third output port and the fourth output port, and the fourth amplifier is coupled between the second input port and the fourth output port.

4. The circuit according to claim 3, wherein the first amplifier, the second amplifier, the third amplifier and the fourth amplifier are devices with three terminals.

5. The circuit according to claim 4, wherein the first amplifier, the second amplifier, the third amplifier and the fourth amplifier are SiGe transistors, hetero junction bipolar transistors, metal-oxide semiconductor field-effect transistors or bipolar junction transistors.

6. The circuit according to claim 4, wherein the first amplifier is a first transistor, the second amplifier is a second transistor, a gate of the first transistor and a source of the second transistor are coupled with the first input port, a drain of the first transistor and a gate of the second transistor are coupled with the first output port, a drain of the second transistor is coupled with the second output port, and a source of the first transistor is grounded.

7. The circuit according to claim 6, wherein the third amplifier is a third transistor, the fourth amplifier is a fourth transistor, a gate of the fourth transistor and a source of the third transistor are coupled with the second input port, a drain of the fourth transistor and a gate of the third transistor are coupled with the fourth output port, a drain of the third transistor is coupled with the third output port, and a source of the third transistor is grounded.

8. The circuit according to claim 7, wherein an amplification of the first transistor and an amplification of the fourth transistor are equal to a first amplification, an amplification of the second transistor and an amplification of the third transistor are equal to a second amplification, a resistance of the first load is equal to a resistance of the second load, and the second amplification is less than or equal to a sum of the first amplification and a reciprocal of the resistance.

9. The circuit according to claim 3, wherein the first single-ended-to-differential converter further includes a third load, and the third load is coupled between the first input port and the second amplifier.

10. The circuit according to claim 9, wherein the second single-ended-to-differential converter further includes a fourth load, and the fourth load is coupled between the second input port and the third amplifier.

11. The circuit according to claim 10, wherein the third load and the fourth load are active devices or passive devices.

12. The circuit according to claim 11, wherein the third load and the fourth load are transistors, resistors, capacitors, inductances or transmission lines.

13. The circuit according to claim 1, wherein the first load and the second load are active devices or passive devices.

14. The circuit according to claim 13, wherein the first load and the second load are transistors, resistors, capacitors, inductances or transmission lines.

15. A differential signal correction circuit, comprising:
a first transistor, wherein a gate of the first transistor is configured to receive a first input signal, and a source of the first transistor is grounded;
a second transistor, wherein a source of the second transistor is coupled with the gate of the first transistor, and a gate of the second transistor is coupled with a drain of the first transistor;
a third transistor, wherein a source of the third transistor is configured to receive a second input signal, the first input signal and the second input signal are differential signal pair, a drain of the third transistor is coupled with the drain of the first transistor, and a gate of the third transistor is coupled with a drain of the second transistor;
a fourth transistor, wherein a gate of the fourth transistor is coupled with the source of the third transistor, a drain of the fourth transistor is coupled with the gate of the third transistor, and a source of the fourth transistor is grounded;
a first load coupled between the drain of the first transistor and a first power source; and
a second load coupled between the drain of the fourth transistor and a second power source;
wherein the first input signal and the second input signal are phase corrected by the first transistor, the second transistor, the third transistor and the fourth transistor, a first output current signal is collected from a coupled node of the drain of the first transistor and the gate of the second transistor, a second output current signal is collected from a coupled node of the gate of the third transistor and the drain of the fourth transistor, the first output current signal is converted into a first output voltage signal by the first load, the second output current signal is converted into a second output voltage signal by the second load, the first output voltage signal is fed back to the first transistor and the second transistor via the coupled node of the drain of the first transistor and the gate of the second transistor, the second output voltage signal is fed back to the third transistor and the fourth transistor via the coupled node of the gate of the third transistor and the drain of the fourth transistor for gain and secondary phase correction.

16. The circuit according to claim 15, wherein an amplification of the first transistor and an amplification of the fourth transistor are equal to a first amplification, an amplification of the second transistor and an amplification of the third transistor are equal to a second amplification, a resistance of the first load is equal to a resistance of the second load, and the second amplification is less than or equal to a sum of the first amplification and a reciprocal of the resistance.

17. The circuit according to claim 16, wherein the first load and the second load are active devices or passive devices.

18. The circuit according to claim 17, wherein the first load and the second load are transistors, resistors, capacitors, inductances or transmission lines.

19. The circuit according to claim 16, further comprising a third load coupled between the gate of the first transistor and the source of the second transistor.

20. The circuit according to claim 19, further comprising a fourth load coupled between the gate of the fourth transistor and the source of the third transistor.

21. The circuit according to claim 20, wherein the third load and the fourth load are active devices or passive devices.

22. The circuit according to claim 21, wherein the third load and the fourth load are transistors, resistors, capacitors, inductances or transmission lines.

* * * * *